United States Patent [19]

Wakabayashi et al.

[11] Patent Number: 5,372,675
[45] Date of Patent: Dec. 13, 1994

[54] METHOD FOR PRODUCING FINE STRUCTURE FOR ELECTRONIC DEVICE

[75] Inventors: Shinichi Wakabayashi; Hitomaro Tougou, both of Kawasaki; Yukio Toyoda, Tokyo, all of Japan

[73] Assignee: Matsushita Electric Industrial Co., Ltd., Osaka, Japan

[21] Appl. No.: 109,586

[22] Filed: Aug. 20, 1993

[30] Foreign Application Priority Data

Aug. 26, 1992 [JP] Japan ................. 4-226876

[51] Int. Cl.$^5$ ............. H01L 21/306; B44C 1/22
[52] U.S. Cl. .................. 156/649; 156/652; 156/655; 156/659.1; 156/662; 437/126; 437/234
[58] Field of Search ............... 156/630, 633, 647, 649, 156/652, 655, 657, 659.1, 661.1, 662; 437/126–133, 234

[56] References Cited

U.S. PATENT DOCUMENTS

| | | | |
|---|---|---|---|
| 4,675,074 | 6/1987 | Wada et al. | 156/649 X |
| 5,034,344 | 7/1991 | Jewell et al. | 156/649 X |
| 5,236,864 | 8/1993 | Iga et al. | 156/649 X |
| 5,266,518 | 11/1993 | Binsma et al. | 156/649 |

OTHER PUBLICATIONS

C. Juang, et al, "Selective etching of GaAs and Al$_{0.3}$Ga$_{0.70}$As with citric acid/hydrogen peroxide solutions", J. Vac. Sci. Technol. B8(5), Sep./Oct. 1990, pp. 1122–1124.

M. Notomi, et al, "Clear energy level shift in ultranarrow In GaAs/InP quantum well wires fabricated by reverse mesa chemical etching", Appl. Phys. Lett. 58(7), Feb. 18, 1991, pp. 720–722.

T. Katoh, et al, "Fabrication of ultrafine gratings on GaAs by electron beam lithography and two-step wet chemical etching", Appl. Phys. Lett. 57(12), Sep. 17, 1990, pp. 1212–1214.

*Primary Examiner*—William Powell
*Attorney, Agent, or Firm*—Stevens, Davis, Miller & Mosher

[57] ABSTRACT

In a method for producing a fine semiconductor structure, a first layer is formed on a second layer, an etching-resistant mask is formed on the first layer, the second layer is etched in an etchant to form a desired shape thereof, a composition of the first layer is different from a composition of the second layer, and at least one of boundary surfaces of the etching-resistant mask and the first layer facing to each other is substantially prevented from including another substance which is different from both of the etching-resistant mask and the first layer.

35 Claims, 2 Drawing Sheets

METHOD FOR PRODUCING FINE STRUCTURE FOR ELECTRONIC DEVICE

Background of the Invention and Related Art Statement

The present invention relates to a method for producing a fine structure for an electronic device.

In a prior-art method for producing a fine structure for an electronic device, as shown in FIG.2, a GaAs buffer layer 92 is crystallized on a GaAs substrate 91, an ($Al_{0.3}$ Ga 0.7 As) barrier layer 93 is crystallized on the GaAs buffer layer 92, a GaAs quantum well layer 94 is crystallized on the barrier layer 93, another ($Al_{0.3}$ $Ga_{0.7}$ As) barrier layer 95 is crystallized on the GaAs quantum well layer 94, and a ($Ga_{0.5}$ $In_{0.5}$ P) mask layer 96 is crystallized on the barrier layer 95. Further, a resist pattern 97 is formed on the ($Ga_{0.5}$ $In_{0.5}$ P) mask layer 96 through an electron-beam lithography process.

The ($Ga_{0.5}$ $In_{0.5}$ P) mask layer 96 is etched by a hydrochloric acid type etchant to form an etching-resistant mask of ($Ga_{0.5}$ $In_{0.5}$ P) corresponding to the resist pattern 97. The ($Al_{0.3}$ $Ga_{0.7}$ As) barrier layer 95, the GaAs quantum well layer 94 and the ($Al_{0.3}$ $Ga_{0.7}$ As) barrier layer 93 under the ($Ga_{0.5}$ $In_{0.5}$ P) mask layer 96 are etched in order by a sulfuric acid type etchant after the resist pattern 97 is removed. Since mentioned layers are arranged in and in another direction substantially perpendicular to the direction, a width of a GaAs quantum fine wire 98 formed from the GaAs quantum well layer 94 is narrower than that of the ($Ga_{0.5}$ $In_{0.5}$ P) mask layer 96.

OBJECT AND SUMMARY OF THE INVENTION

An object of the present invention is to provide a fine structure producing method for an electronic device, applicable to forming correctly a quantum-level fine semiconductor structure.

According to the present invention, a method for producing a fine semiconductor structure comprises the steps of:

forming a first layer on a second layer, forming an etching-resistant mask on the first layer, and etching the second layer in an etchant to form a desired shape thereof, wherein a composition of the first layer is different from a composition of the second layer, and at least one of boundary surfaces of the etching-resistant mask and the first layer facing to each other is substantially prevented from including another substance which is different from both of the etching-resistant mask and the first layer.

Since the first layer whose composition is different from the composition of the second layer is arranged between the second layer and the etching-resistant mask and at least one of the boundary surfaces of the etching-resistant mask and the first layer facing to each other is substantially prevented from including another substance which is different from both of the etching-resistant mask and the first layer, an etching along the boundary surface of the first layer is not caused or accelerated by the other substance so that a shape of the first layer is correctly maintained or changed during the etching and the desired shape of the second layer is not deteriorated by an error in shape of the first layer on the second layer during the etching.

The second layer may be made of a semiconductor material to form a semiconductor device therefrom, or of an etching-resistant material which is etched by a first etchant to form another etching-resistant mask during the above-mentioned etching but cannot be etched by a second etchant different from the first etchant to be used as the another etching-resistant mask when a layer under the another etching-resistant mask is etched by the second etchant during another subsequent etching.

The first layer may be etched simultaneously when the second layer is etched so that etched outer surfaces of the first and second layers extend continuously relatively to each other and particularly an accuracy of the shape of second layer on and after the etching is improved, or alternatively the first layer may be made of an etching-resistant material and prevented from being etched simultaneously when the second layer is etched so that the first layer acts as another etching-resistant mask for the second layer and any material can be utilized for the second layer in spite of a material of the etching-resistant mask, or in other words, the second layer to be etched is not affected by the etching-resistant mask. When the first layer may be made of an etching-resistant material against the above mentioned etching or etchant, it is preferable to etch the first layer by another etchant before the above mentioned etching to form a desired or suitable shape thereof for etching the second layer.

The another substance may be a degeneration substance of at least one of the etching-resistant mask and the first layer, or a component in the atmosphere. The degeneration is caused by a chemical reaction between the etching-resistant mask and the first layer, between the etching-resistant mask and a component existing therearound or between the first layer and a component therearound.

The first layer may be prevented from being used as an electro-conductive or semiconductive element for the semiconductor device after the etching so that an error in shape of the first layer after the etching does not affect the semiconductor device. Alternatively, the first layer may be used as the electro-conductive or semiconductive element for the semiconductor device after the etching, when the error in shape of the first layer after the etching does not significantly affect the semiconductor device. The first layer may be used as an electrically insulating element for the semiconductor device after the etching.

A direction in which the first layer, the second layer and the etching-resistant mask are laminated may be substantially perpendicular or parallel to a direction in which the etching proceeds.

The second layer may be used as at least one of a P-type semiconductor element, an N-type semiconductor element, a quantum fine wire, a quantum well and a quantum box of the semiconductor device, after the etching.

The other substance may be at least one of an oxide, nitride or the like degeneration substance of at least one of the etching-resistant mask and the first layer. In order to prevent a generation of the oxide degeneration substance in the boundary surface, it is preferable that at least one of the etching-resistant mask and the first layer be prevented from including an unoxidized aluminum before forming the etching-resistant mask on the first layer.

In order to improve an affinity between the boundary surfaces, it is preferable that at least one component of the etching-resistant mask be equal to that of the first layer, or that a main component of the etching-resistant mask be equal to that of the first layer.

At least one of boundary surfaces of the second layer and the first layer facing each other may be substantially prevented from having the other substance which is different from both of the second layer and the first layer. The other substance may be a degeneration substance of at least one of the second layer and the first layer or a component in the atmosphere.

The first layer may be etched simultaneously when the second layer is etched, and an etching proceeding rate of the first layer may be substantially equal to, more than or less than that of the second layer. When the etching proceeding rate of the first layer is substantially equal to that of the second layer, the etched outer surfaces of the first and second layers extend perfectly continuously relatively to each other and the accuracy of the shape of second layer on and after the etching is significantly improved.

It is preferable that a component of the second layer be equal to that of the first layer, or that a main component of the second layer is equal to that of the first layer, in order to improve an affinity between the first and second layers.

It is preferable that the first layer be made of a material which is difficult to be oxidized in comparison with at least the second layer or that the first layer be made of a material which is difficult to degenerate in comparison with at least the second layer. Further, the present invention is especially suitable, when the second layer is made of a material which is easily oxidized in comparison with at least the first layer, or the second layer is made of a material which degenerates easily in comparison with at least the first layer, for example, when the second layer includes (needs to include) unoxidized aluminum.

It is preferable that a crystal lattice structure of the first layer be substantially similar to that of the second layer, or a crystal lattice atomic or elemental distance of the first layer approximate roughly to that of the second layer.

It is preferable that a crystal lattice structure of the first layer be substantially similar to that of the etching-resistant mask, or a crystal lattice atomic or elemental distance of the first layer approximate roughly to that of the etching-resistant mask.

DETAILED DESCRIPTION OF THE PREFERRED EMBODIMENTS

Figure 1:
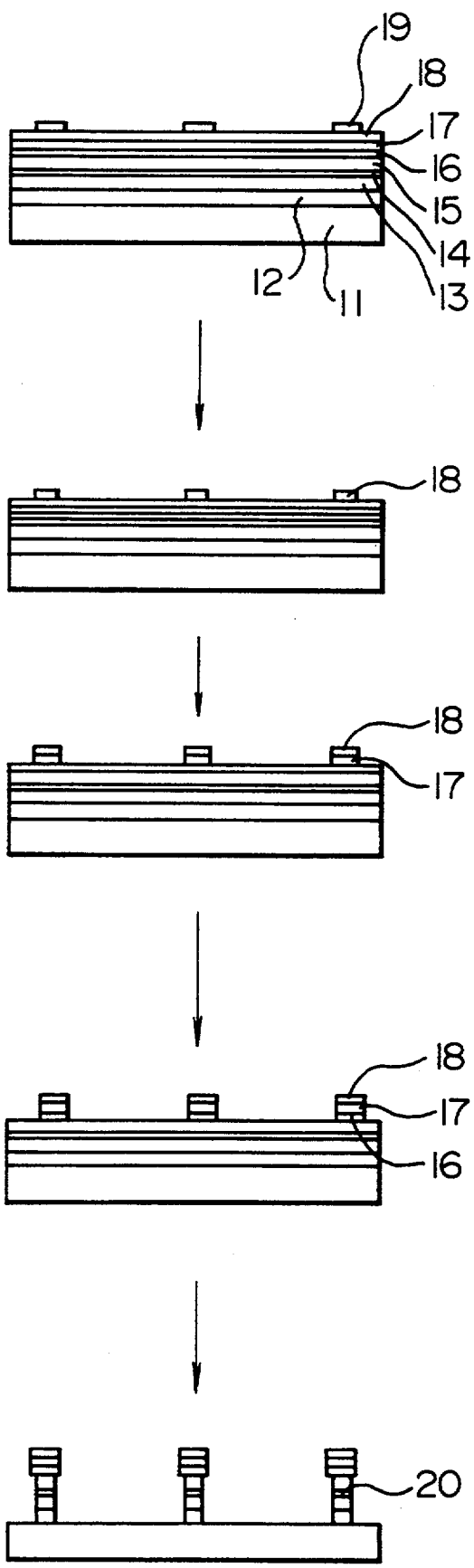
FIG. 1 is a series of drawings, each of which shows a semiconductor structural change caused by a method according to the present invention.
Figure 2:
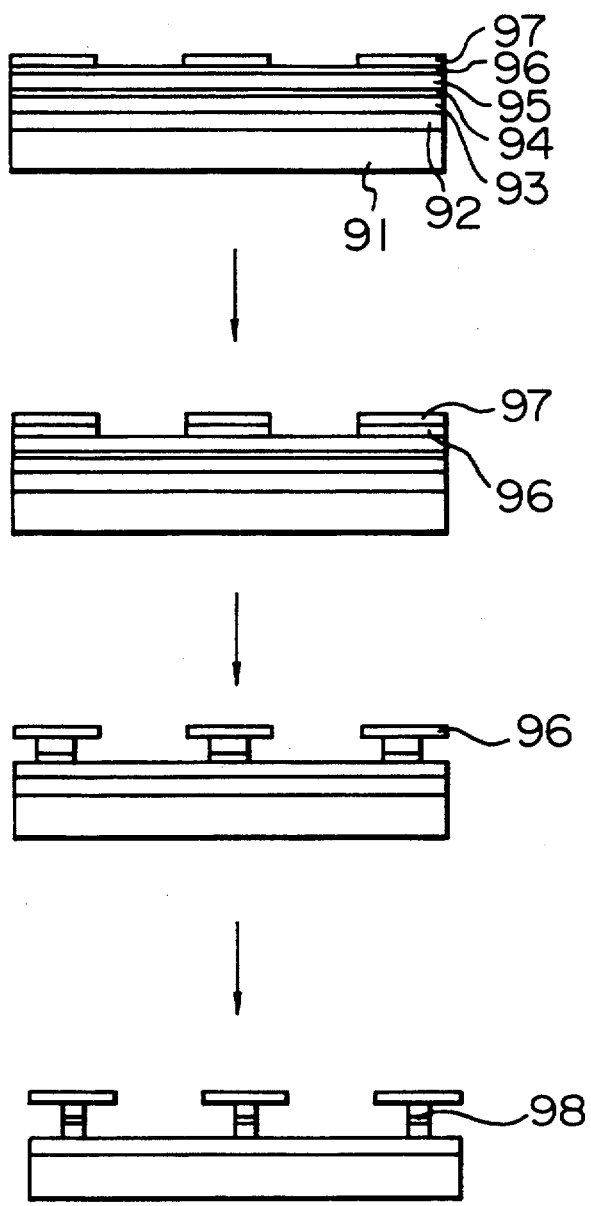
FIG. 2 is a series of drawings, each of which shows a semiconductor structural change caused by prior-art method.

As shown in FIG. 1, a GaAs buffer layer 12 is crystallized on a GaAs substrate 11, an $(Al_{0.3} Ga_{0.7} As)$ barrier layer 13 is crystallized on the GaAs buffer layer 12, a GaAs quantum well layer 14 is crystallized on the barrier layer 13, another $(Al_{0.3} Ga_{0.7} As)$ barrier layer 15 is crystallized on the GaAs quantum well layer 14, a GaAs spacer layer 16 as the claimed first layer with a thickness of approximately 10 nm is crystallized on the another $(Al_{9.3} Ga_{0.7} As)$ barrier layer 15, a $(Ga_{0.5} In_{0.5} P)$ mask layer 17 with a thickness of approximately 10 nm is crystallized on the GaAs spacer layer 16, and a silicon oxide layer 18 is deposited on the $(Ga_{0.5} In_{0.5} P)$ mask layer 17. The crystallizations are performed continuously. Further, a resist pattern 19 is formed on the silicon oxide layer 18 through an electron-beam lithography process. Preferably, a direction of the resist pattern 19 is directed substantially along a 110 crystal orientation of the barrier layers 13, 15 and/or the quantum well layer 14.

A part of the silicon oxide layer 18 which is not covered by the resist pattern 19 is etched by a hydrofluoric acid type etchant to form an etching-resistant mask of the silicon oxide corresponding to the resist pattern 19. Subsequently, a part of the $(Ga_{0.5} In_{0.5} P)$ mask layer 17 which is not covered by the etching-resistant mask of the silicon oxide is etched a hydrochloric acid type etchant ($HCl:H_2O = 2:1$) to form another etching-resistant mask as the claimed etching-resistant mask of $(Ga_{0.5} In_{0.5} P)$ corresponding to the etching-resistant mask of the silicon oxide. Incidentally, the $(Al_{0.3} Ga_{0.7} As)$ barrier layer cannot be etched by the hydrochloric acid type etchant.

The resist pattern 19 may be formed directly on the $(Ga_{0.5} In_{0.5} P)$ mask layer 17 without the silicon oxide layer 18 to form directly the another etching-resistant mask of $(Ga_{0.5} In_{0.5} P)$, but, in this case, a boundary surface of the $(Ga_{0.5} In_{0.5} P)$ mask layer 17 facing to a boundary surface of the resist pattern 19 is etched by the hydrochloric acid type etchant significantly largely and a shape of the other etching-resistant mask of $(Ga_{0.5} In_{0.5} P)$ does not correspond correctly to the resist pattern 19, because a direct contact between the boundary surface of the $(Ga_{0.5} In_{0.5} P)$ mask layer 17 and the boundary surface of the resist pattern 19 is deteriorated in comparison with a direct contact between the boundary surface of the $(Ga_{0.5} In_{0.5} P)$ mask layer 17 and a boundary surface of the silicon oxide layer 18 facing to each other.

Parts of the GaAs spacer layer 16, the $(Al_{0.3} Ga_{0.7} As)$ barrier layer 15, the GaAs quantum well layer 14 and the $(Al_{0.3} Ga_{0.7} As)$ barrier layer 13 under the $(Ga_{0.5} In_{0.5} P)$ mask layer 17 are etched in order by a sulfuric acid type etchant ($H_2SO_4: H_2O_2: H_2O = 1:1:20$). The $(Ga_{0.5} In_{0.5} P)$ mask layer 17 is not etched by the sulfuric acid type etchant to act as another etching-resistant mask. Since the etching proceeds in a direction in which the above-mentioned layers are arranged and in another direction substantially perpendicular to the direction, a width of a GaAs quantum wire 20 formed from the GaAs quantum well layer 14 is narrower than that of the other etching-resistant mask of $(Ga_{0.5} In_{0.5} P)$. A shape or width of each of the GaAs spacer layer 16, the $(Al_{0.3} Ga_{0.7} As)$ barrier layer 15, the GaAs quantum well layer 14 and the $(Al_{0.3} Ga_{0.7} As)$ barrier layer 13 corresponds correctly to the other etching-resistant mask of $(Ga_{0.5} In_{0.5} P)$, because a direct contact between the boundary surface of the $(Ga_{0.5} In_{0.5} P)$ mask layer 17 and a boundary surface of the GaAs spacer layer 16 facing each other is sufficient for prevent an excessive etching proceeding therebetween.

A ratio of Ga and a ratio of In in the Ga-In-P compound are changeable between 0.45 and 0.5 so that a crystal lattice of the Ga-In-P compound matches that of the GaAs compound. If the etching-resistant mask has a fine lattice pattern, a quantum box structure is formed.

| Other embodiment combinations of the present invention (I) | | | | | |
|---|---|---|---|---|---|
| Etching-resistant mask layer | First layer as spacer layer | Second layer | Third layer | Fourth layer | Remarks |
| $Ga_{0.5}In_{0.5}P$ | GaAs | $Al_{0.3}Ga_{0.7}As$ | GaAs | $Al_{0.3}Ga_{0.7}As$ | |
| $Ga_{0.5}In_{0.5}P$ | GaAs | $(Al_xGa_{1-x})_{0.5}In_{0.5}P$ | GaAs | $(Al_xGa_{1-x})_{0.5}In_{0.5}P$ | $0 < x < 1$ |
| $Ga_{0.5}In_{0.5}P$ | GaAs | $(Al_xGa_{1-x})_{0.5}In_{0.5}P$ | $Ga_{0.5}In_{0.5}P$ | $(Al_xGa_{1-x})_{0.5}In_{0.5}P$ | $0 < x < 1$ |
| $Ga_{0.75}In_{0.25}As_{0.5}P_{0.5}$ | GaAs | $Al_{0.3}Ga_{0.7}As$ | GaAs | $Al_{0.3}Ga_{0.7}As$ | |
| $Ga_{0.75}In_{0.25}As_{0.5}P_{0.5}$ | GaAs | $(Al_xGa_{1-x})_{0.5}In_{0.5}P$ | GaAs | $(Al_xGa_{1-x})_{0.5}In_{0.5}P$ | $0 < x < 1$ |
| $Ga_{0.75}In_{0.25}As_{0.5}P_{0.5}$ | GaAs | $(Al_xGa_{1-x})_{0.5}In_{0.5}P$ | $Ga_{0.5}In_{0.5}P$ | $(Al_xGa_{1-x})_{0.5}In_{0.5}P$ | $0 < x < 1$ |

For $(Al_xGa_{1-x})_{0.5}In_{0.5}P$ and $Ga_{0.75}In_{0.25}As_{0.5}P_{0.5}$, hydrochloric acid type etchant is used.

| Other embodiment combinations of the present invention (II) | | | | | |
|---|---|---|---|---|---|
| Etching-resistant mask layer | First layer as spacer layer | Second layer | Third layer | Fourth layer | Remarks |
| $Ga_{0.47}In_{0.53}As$ | InP | $(Al_xGa_{1-x})_{0.47}In_{0.53}As$ | InP | $(Al_xGa_{1-x})_{0.47}In_{0.53}As$ | $0 < x < 1$ |
| $Ga_{0.14}In_{0.86}As_{0.3}P_{0.7}$ | InP | $(Al_xGa_{1-x})_{0.47}In_{0.53}As$ | InP | $(Al_xGa_{1-x})_{0.47}In_{0.53}As$ | $0 < x < 1$ |
| $InAs_{0.82}Sb_{0.08}P_{0.10}$ | InAs | $InAs_{0.82}Sb_{0.08}P_{0.10}$ | InAs | $InAs_{0.82}Sb_{0.08}P_{0.10}$ | |
| $Ga_{0.84}In_{0.16}As_{0.15}Sb_{0.85}$ | GaSb | $Al_{0.27}Ga_{0.73}As_{0.04}Sb_{0.96}$ | GaSb | $Al_{0.27}Ga_{0.73}As_{0.04}Sb_{0.96}$ | |
| $Pb_{0.93}Sn_{0.07}Te$ | PbTe | $Pb_{0.93}Sn_{0.07}Te$ | PbTe | $Pb_{0.93}Sn_{0.07}Te$ | |

For $Ga_{0.47}In_{0.53}As$ and $Ga_{0.14}In_{0.86}As_{0.3}P_{0.7}$, Sulfuric acid type etchant is used, and for InP, hydrochloric acid type etchant is used.

What is claimed is:

1. A method for producing a fine structure for an electronic device, comprising the steps of: forming a semiconductor first layer on a second layer; forming an etching-resistant mask on the first layer to shape the first layer; and etching the second layer in an etchant so that a width of the second layer is made smaller than a width of the first layer by the etchant while the first layer is substantially prevented from being etched in the etchant.

2. A method according to claim 1, wherein the second layer is made of a semiconductor material to form a semiconductor device.

3. A method according to claim 1, wherein
a composition of the first layer is different from a composition of the second layer, and at least one of boundary surfaces of the etching-resistant mask and the first layer facing to each other is substantially prevented frm having another substance which is different from both of the etching-resistant mask and the first layer.

4. A method according to claim 1, wherein the etching-resistant mask is made of GaInP, the first layer is made of GaAs, and the second layer is made of AlGaAs.

5. A method according to claim 1, wherein the etching-resistant mask is made of GaInP, the first layer is made of GaAs, and the second layer is made of AlGaAs.

6. A method according to claim 3, wherein the another substance is a degeneration substance of at least one of the etching-resistant mask and the first layer.

7. A method according to claim 3, wherein the another substance is a component in the atmosphere.

8. A method according to claim 2, wherein the first layer is prevented from being used as an electro-conductive element for the semiconductor device, after the etching.

9. A method according to claim 2, wherein the first layer is prevented from being used as a semiconductive element for the semiconductor device, after the etching.

10. A method according to claim 2, wherein the first layer is used as an electro-conductive element for the semiconductor device, after the etching.

11. A method according to claim 2, wherein the first layer is used as a semiconductive element for the semiconductor device, after the etching.

12. A method according to claim 2, wherein the first layer is used as an electrically insulating element for the semiconductor device, after the etching.

13. A method according to claim 1, wherein a direction in which the first layer, the second layer and the etching-resistant mask are laminated is substantially perpendicular to a direction in which the etching proceeds.

14. A method according to claim 1, wherein a direction in which the first layer, the second layer and the etching-resistant mask are laminated is substantially equal to a direction in which the etching proceeds.

15. A method according to claim 2, wherein the second layer is used as at least one of a P-type semiconductor element, a N-type semiconductor element, a quantum wire, a quantum well and a quantum box of the semiconductor device, after the etching.

16. A method according to claim 3, wherein the another substance includes at least one of an oxide degeneration substance and a nitride degeneration substance of at least one of the etching-resistant mask and the first layer.

17. A method according to claim 1, wherein at least one of the etching-resistant mask and the first layer is prevented from including an unoxidized aluminum before forming the etching-resistant mask on the first layer.

18. A method according to claim 1, wherein at least one component of the etching-resistant mask is equal to that of the first layer.

19. A method according to claim 1, wherein a main component of the etching-resistant mask is equal to that of the first layer.

20. A method according to claim 1, wherein at least one of boundary surfaces of the second layer and the first layer facing to each other is substantially prevented from having another substance which as different from both of the second layer and the first layer.

21. A method according to claim 1, wherein at least one of boundary surfaces of the second layer and the first layer facing to each other is substantially prevented from having another substance which as different from both of the second layer and the first layer, and the another substance is a degeneration substance of at least one of the second layer and the first layer.

22. A method according to claim 1, wherein at least one of boundary surfaces of the second layer and the first layer facing to each other is substantially prevented from having another substance which is different from both of the second layer and the first layer, and the another substance is a component in the atmosphere.

23. A method according to claim 1, wherein the first layer is etched simultaneously when the second layer is etched, and an etching proceeding rate of the first layer is substantially equal to that of the second layer.

24. A method according to claim 1, wherein the first layer is etched simultaneously when the second layer is etched, and an etching proceeding rate of the first layer is more than that of the second layer.

25. A method according to claim 1, wherein the first layer is etched simultaneously when the second layer is etched, and an etching proceeding rate of the first layer is less than that of the second layer.

26. A method according to claim 1, wherein a component of the second layer is equal to that of the first layer.

27. A method according to claim 1, wherein a main component of the second layer is equal to that of the first layer.

28. A method according to claim 1, wherein the first layer is made of a material which is difficult to be oxidized.

29. A method according to claim 1, wherein the second layer is made of a material which is easily oxidized in comparison with the first layer.

30. A method according to claim 1, wherein the first layer is made of a material which is difficult to degenerate.

31. A method according to claim 1, wherein the second layer is made of a material which degenerates easily in comparison with the first layer.

32. A method according to claim 1, wherein the etching-resistant mask is made of GaInAsP, the first layer is made of GaAs, and the second layer is made of AlGaAs.

33. A method according to claim 1, wherein the etching-resistant mask is made of GaInAsP, the first layer is made of GaAs, and the second layer is made of AlGaInP.

34. A method according to claim 1, wherein the etching-resistant mask is made of GaInAs, the first layer is made of InP, and the second layer is made of AlGaInAs.

35. A method according to claim 1, wherein the etching-resistant mask is made of GaInAsP, the first layer is made of InP, and the second layer is made of AlGaInAs.

* * * * *